US 6,344,392 B1

(12) United States Patent
Liaw

(10) Patent No.: US 6,344,392 B1
(45) Date of Patent: Feb. 5, 2002

(54) METHODS OF MANUFACTURE OF CROWN OR STACK CAPACITOR WITH A MONOLITHIC FIN STRUCTURE MADE WITH A DIFFERENT OXIDE ETCHING RATE IN HYDROGEN FLUORIDE VAPOR

(75) Inventor: Ing-Ruey Liaw, Hsinchu (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/192,457

(22) Filed: Nov. 16, 1998

(51) Int. Cl.⁷ .......................................... H01L 21/8242
(52) U.S. Cl. ...................... 438/254; 438/253; 438/396; 438/397
(58) Field of Search ................................ 257/306, 307, 257/308, 309; 438/397, 254, 239, 253, 255, 396, 398

(56) References Cited

U.S. PATENT DOCUMENTS

| 5,142,639 A | * | 8/1992 | Kohyama et al. ........... 257/306 |
| 5,164,337 A | * | 11/1992 | Ogawa et al. ............... 438/254 |
| 5,170,233 A | * | 12/1992 | Liu et al. .................... 257/308 |
| 5,208,180 A | | 5/1993 | González ..................... 437/60 |
| 5,240,871 A | * | 8/1993 | Doan et al. .................. 438/397 |
| 5,330,928 A | * | 7/1994 | Tseng ......................... 438/254 |
| 5,532,182 A | | 7/1996 | Woo ............................ 437/52 |
| 5,573,967 A | | 11/1996 | Tseng .......................... 437/52 |
| 5,631,184 A | | 5/1997 | Ikemasu et al. ............. 438/397 |
| 5,637,523 A | | 6/1997 | Fazan et al. ................. 438/397 |
| 5,656,536 A | | 8/1997 | Wu ............................. 438/397 |
| 5,677,222 A | * | 10/1997 | Tseng ......................... 438/253 |
| 5,716,884 A | * | 2/1998 | Hsue et al. .................. 438/254 |
| 5,763,286 A | * | 6/1998 | Figura et al. ............... 438/255 |
| 5,766,994 A | * | 6/1998 | Tseng ......................... 438/254 |
| 5,770,499 A | * | 6/1998 | Kwok et al. ................ 438/253 |
| 5,835,337 A | * | 11/1998 | Watanabe et al. ......... 361/301.4 |
| 5,843,822 A | * | 12/1998 | Hsia et al. .................. 438/254 |
| 5,851,876 A | * | 12/1998 | Jenq ........................... 438/253 |
| 5,851,897 A | * | 12/1998 | Wu ............................. 438/397 |
| 5,998,260 A | * | 12/1999 | Lin ............................. 438/254 |
| 6,024,888 A | * | 2/2000 | Watanabe et al. ............ 216/73 |

* cited by examiner

Primary Examiner—Stephen D. Meier
Assistant Examiner—Toniae M. Thomas
(74) Attorney, Agent, or Firm—George O. Saile; Stephen B. Ackerman; Graham S. Jones, II

(57) ABSTRACT

A capacitor core is formed on a semiconductor device with a first conductive layer in contact with a plug. A mold is formed from a stack of alternately doped and undoped silicon dioxide layers on the sublayer with the stack comprising a bottom layer formed on top of the sublayer and each additional layer in the stack formed on a previous one of the layers in the stack. Pattern the silicon dioxide layers in the mold which are alternatingly doped and undoped to form an intercore, capacitor-core-shaping cavity in the stack of silicon dioxide layers reaching down through the stack to be bottom of the stack. Then perform differential etching of the silicon dioxide layers in the mold. Form undercut edges in the doped silicon dioxide layers with the undoped silicon dioxide layers having cantilevered ribs projecting from the stacks into the cavity to complete the mold. Deposit a bulk or a thin film second monolithic conductive layer into the cavity to form a monolithic capacitor core with counterpart cantilevered ribs.

18 Claims, 6 Drawing Sheets

METHODS OF MANUFACTURE OF CROWN OR STACK CAPACITOR WITH A MONOLITHIC FIN STRUCTURE MADE WITH A DIFFERENT OXIDE ETCHING RATE IN HYDROGEN FLUORIDE VAPOR

BACKGROUND OF THE INVENTION

1. Field of the Invention

This invention relates to capacitors for DRAMs and more particularly to lower electrodes of crown capacitors with fins or to lower electrodes of stack capacitors.

2. Description of Related Art

U.S. Pat. No. 5,208,180 of Gonzalez shows a "Method of Forming a Capacitor" using a oxide etching process.

U.S. Pat. No. 5,532,182 of Woo for a "Method for Fabricating Stacked Capacitor of a DRAM Cell" shows a fin type capacitor using doped and undoped amorphous Si layers.

U.S. Pat. No. 5,573,967 of Tseng describes a "Method for Making Dynamic Random Access Memory with Fin-type Stacked Capacitor".

U.S. Pat. No. 5,631,184 of Ikemasu et al. describes a "Method of Producing a Semiconductor Device Having a Fin-type Capacitor."

U.S. Pat. No. 5,637,523 of Fazan describes a "Method for Forming a Capacitor and a Capacitor Structure" shows a in type capacitor formed by etching doped and undoped polysilicon layers.

U.S. Pat. No. 5,656,536 of Wu describes a "Method of Manufacturing a Crown Shaped Capacitor with Horizontal Fins for High Density DRAMS."

SUMMARY OF THE INVENTION

A fin structure can be made by alternately depositing silicon nitride ($Si_3N_4$) and silicon dioxide ($SiO_2$) and dipping back and then filling with a polysilicon layer which is a complicated process.

A crown or stack capacitor with a fin structure is made with a different silicon dioxide etching rate in a vapor of hydrogen fluoride HF acid environment.

This invention teaches a method of forming a fin structure using a combination of both doped and undoped silicon dioxide layers with a bulk or a thin film second conductive layer formed into a capacitor core. The core can be composed of a monolithic body of conductive material.

In accordance with this invention, a process of forming an electrode comprises the steps of formation of a capacitor core formed on a semiconductor device which contains doped regions in the surface thereof blanketed with a dielectric layer which contains a conductive plug extending therethrough which contacts one of the doped regions in the semiconductor substrate.

First, form a sublayer comprising a first conductive layer in contact with a plug which contacts one of the doped regions in the semiconductor substrate. Form a mold from a stack of silicon dioxide layers which are alternatingly an undoped layer covered with a doped layer on the sublayer comprising the first conductive layer with the stack comprising a bottom layer formed on top of the sublayer and each additional layer in the stack formed on a previous one of the layers in the stack. Pattern the silicon dioxide layers in the mold which are alternatingly doped and undoped to form an intercore, capacitor-core-shaping cavity in the stack of silicon dioxide layers reaching down through the stack to be bottom of the stack. Perform differential etching of the silicon dioxide layers in the mold. Form undercut edges in the doped silicon dioxide layers with the undoped silicon dioxide layers having cantilevered ribs projecting from the stacks into the cavity to complete the mold. Deposit a layer of polysilicon into the cavity forming a capacitor core with counterpart ribs cantilevered (projecting) with a complementary pattern to the mold and the capacitor core having a top surface. Polish the capacitor core to remove the top surface of the core, and remove the mold.

Preferably, the mold is etched with a combination of hydrogen fluoride vapor and water vapor.

In one embodiment, the core is formed of a solid deposit of a second conductive layer which fills the cavity. The dopant comprises boron and phosphorus and the mold is etched with a combination of hydrogen fluoride vapor and water vapor.

Preferably, the dopant comprises boron and phosphorus, and the mold is etched with a combination of hydrogen fluoride vapor and water vapor.

The core is planarized by a CMP process which removes a top undoped layer of the mold whereby the core has a flat upper surface with a rib located on top of the core, and etch back the sublayer comprising a first thin conductive layer to separate the core from adjacent cores.

Alternatively one can deposit a thin layer of a second conductive layer such as polysilicon into the cavity. Then, form a thin capacitor core with an array of counterpart cantilevered (projecting) ribs with a pattern which is complementary to the pattern of the mold. The capacitor core has a top surface.

In the case of the thin layer of the second conductive layer, next deposit a photoresist layer into the inner cavity filling the inner cavity. Then polish the capacitor core to remove the top surface of the core, and remove the photoresist and remove the mold.

Then etch back the sublayer comprising a first thin conductive layer to separate the core from adjacent cores.

Preferably, the core is a monolithic core.

In accordance with another aspect of this invention, a monolithic capacitor core is formed on a semiconductor device. A sublayer comprising a first conductive layer is formed in contact with a plug which contacts a doped first conductive region in the semiconductor substrate. A second conductive layer is formed into a monolithic capacitor core having cantilevered ribs projecting from exterior sidewalls of the monolithic core. The monolithic capacitor core has a cantilevered top surface projecting from the exterior sidewall of the monolithic core.

Preferably the second conductive layer is formed into a hollow monolithic capacitor core having cantilevered ribs projecting from exterior sidewalls of the monolithic core and a base covering the first conductive layer. It that case it is preferred that the second conductive layer formed into a monolithic core is composed of a material selected from the group consisting of aluminum, copper, tungsten, doped polysilicon, and titanium nitride, and said second conductive layer has a thickness from about 500 Å to about 1,000 Å.

Alternatively, the second conductive layer is formed as a solid monolithic capacitor core having cantilevered ribs projecting from exterior sidewalls of the monolithic core and the core covering the first conductive layer.

BRIEF DESCRIPTION OF THE DRAWINGS

The foregoing and other aspects and advantages of this invention are explained and described below with reference to the accompanying drawings, in which.

DESCRIPTION OF STRUCTURE ANCILLARY TO THE PREFERRED EMBODIMENT

Figure 1:
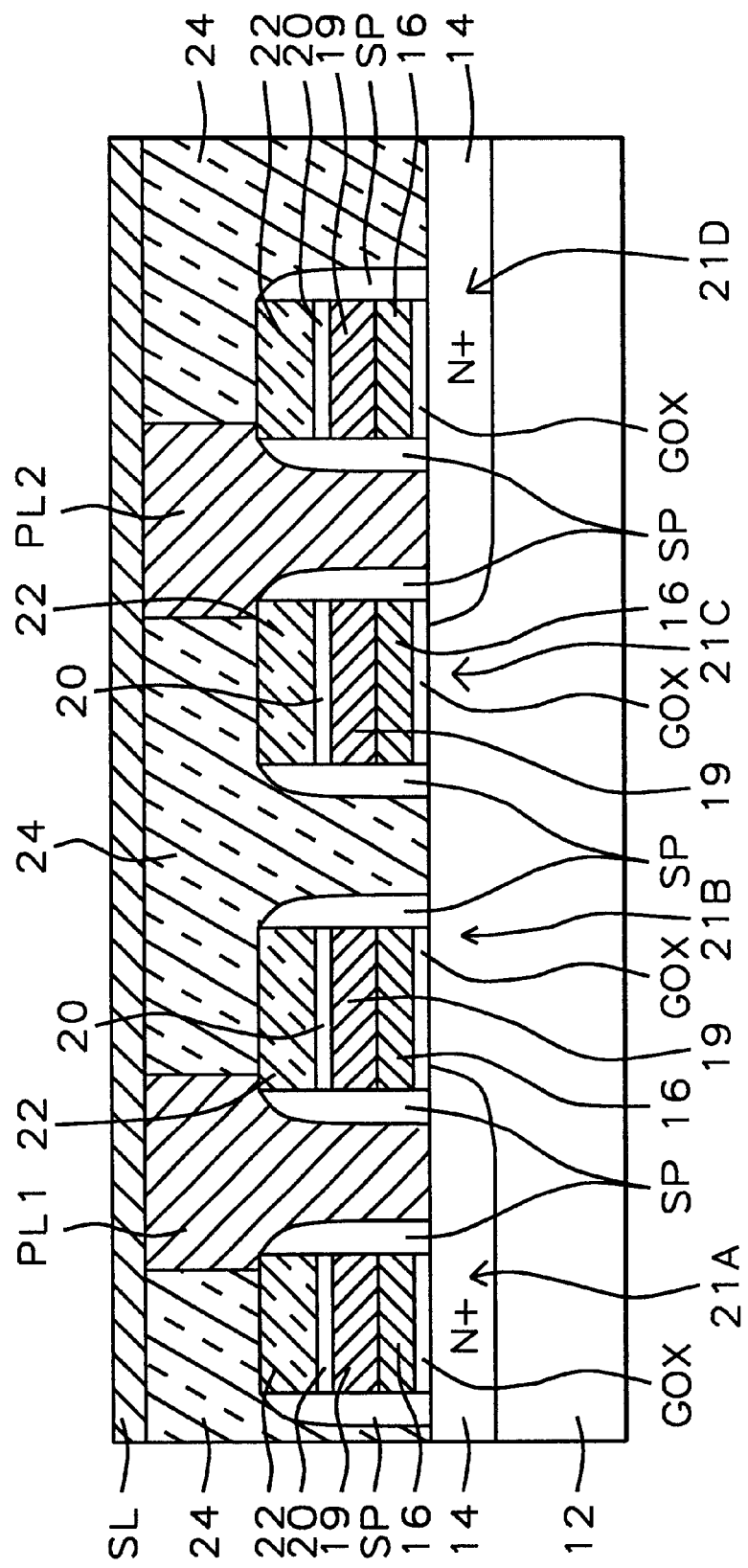
FIG. 1 shows a sectional vertical elevation of a fragment of a semiconductor device with a first conductive layer formed on the top surface in an intermediate stage of fabrication of a device in accordance with this invention.

FIG. 1 shows a sectional vertical elevation of a fragment of a semiconductor device 10 in an intermediate stage of fabrication of a device in accordance with this invention. A P-doped silicon semiconductor substrate 12 is shown with N+ doped regions 14 and 14' formed in the surface of the substrate 12 and spaced on opposite ends of the portion of substrate 12 shown in FIG. 1. Four gate electrode/conductor stacks 21A–21D are shown on the surface of substrate 12 with the stack 21A formed on the surface of an N+ doped region 14 and stack 21D formed on the surface of an N+ doped region 14'.

The stacks 21A–21D include gate oxide regions GOX on which polysilicon conductor/gate electrode layers 16 are formed on the surface of substrate 12. On each of the gate oxide regions GOX is a refractory metal silicide layer 19 such as tungsten silicide ($WSi_2$), a cap layer usually composed of silicon dioxide ($SiO_2$) layer 20 and a silicon nitride ($Si_3N_4$) layer 22 which can be implemented, as is well understood by those skilled in the art and as is described in the U. S. Pat. No. 5,792,689 of Fu-Lian Yang and Erik S. Jeng for "Method for Manufacturing Double Crown Capacitors Self-Aligned to Node Contacts on Dynamic Random Access Memory".

Silicon dioxide sidewall spacers SP are formed on the sidewalls of the layers 16, 19, 20 and 22 of stacks 21A–21D as described in Liaw et al U.S. Pat. No. 5,712,202. Layers 20, 22 and spacers SP insulate the layers 16/19 from the polysilicon plugs PL which are formed between stacks 21A/21B and 21C/21D which reach the capacitor node contacts where plugs PL are formed on the surface of P-substrate 12.

There are doped regions 14 and 14' in the surface of the substrate 12 having top surfaces to which the plugs PL1 and PL2 respectively make electrical and mechanical contact, as in Liaw et al U.S. Pat. No. 5,712,202 and in Yang et al U.S. Pat. No. 5,792,689.

A planarizing insulating layer 24 composed of BPSG has been formed as described in Liaw et al U.S. Pat. No. 5,712,202 covering the stacks 21A–21D and the substrate 12, but capacitor node contact openings have been formed between the sidewall spacers SP of stacks 21A and 21B on the left and between the sidewall spacers SP of stacks 21C and 21D on the right and those openings have been filled with metal, conductive plugs PL1/PL2 extending from contact with the N+ doped regions 14/14' respectfully on the surface of the substrate 12 between the stacks 21A/21B and between the stacks 21C/21D to the top surface of the BPSG layer 24.

DESCRIPTION OF THE PREFERRED EMBODIMENT

Step 1

Above the BPSG layer 24 and plugs PL1/PL2 a doped, thin first conductive layer/sublayer SL composed of doped polysilicon is formed on the surface of the device of FIG. 1. In step 1, after the capacitor node contact and polysilicon plugs PL1/PL2 are formed a thin polysilicon sublayer comprising a first conductive layer SL is deposited which can be implanted with arsenic with a dose in the range from about 1E20 to 1E22 ions/$cm^2$ and an energy between 30 keV and 45 keV thus giving the first conductive layer SL a dopant concentration from about 1E20 ions/$cm^3$ to 1E22 ions/$cm^3$. Preferably, the first conductive layer SL has a thickness from about 5000 Å to about 1000 Å with a preferable thickness of about 8,000 Å.

Step 2

Figure 2:
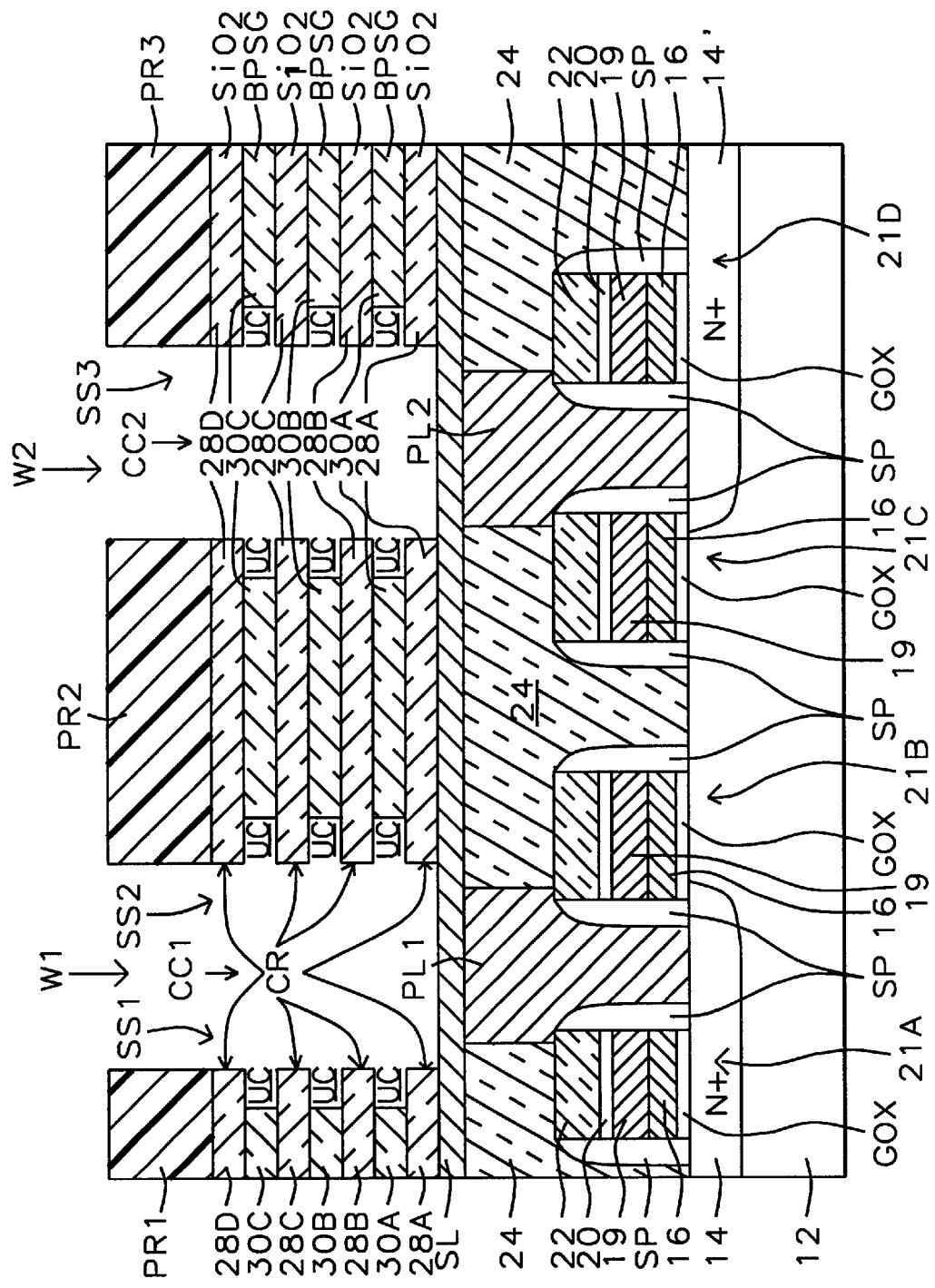
FIG. 2 shows the device of FIG. 1 after formation of sacrificial structures which are to serve as molds with monolithic capacitor core cavities formed of stacks of laminated, blanket layers formed over the first conductive layer.

Referring to FIG. 2, the device of FIG. 1 is shown after formation of molds (sacrificial structures) SS1, SS2 and SS3 formed of a stack of laminated, blanket layers formed over first conductive layer SL SL. The molds SS1, SS2 and SS3 comprise undoped silicon dioxide ($SiO_2$) layer 28A–28D alternating with $SiO_2$ layers 30A–30C which are doped with Boron/Phosphorus (B/P) dopant to form a doped glass dielectric, i.e. BPSG. The sequence is to form an undoped $SiO_2$ layer 28A on the bottom, then form a BPSG layer 30A, covered in turn with an undoped $SiO_2$ layer 28B, followed by BPSG layer 30B and topped with undoped $SiO_2$ layer 28C. The alternating laminated layers 28A–28D and 30A–30C are formed in situ in a CVD chamber alternately, by depositing one of the undoped oxide layers 28A–28D, followed by depositing one of the BSPG layers 30A–30C in the same chamber of the CVD equipment in a continuous, uninterrupted process by periodically opening and closing the B/P dopant source in a CVD chamber as is described below, and as will be well understood by those skilled in the art.

Step 2 involves depositing undoped oxide blanket layers 28A/28B/28C/28D and boron/phosphorous doped silicon oxide blanket layers 30A/30B/30C alternately in the same chamber of the CVD equipment by opening and closing the B/P dopant source in a periodic way to form $SiO_2$ layers 28A/28B/28C/28D alternating with BPSG glass layers 30A/30B/30C.

Step 3

Then patterning mask sections PR1/PR2/PR3 with windows W1 and W2 therebetween are formed over the layer 28D on top of the blanket laminated layers 28A/30A/28B/30B/28C/30C/28D of $SiO_2$ alternating with BPSG glass layers. The layers 28A/30A/28B/30B/28C/30C/28D are then patterned into sacrificial molds SS1–SS3 and etched using the mask sections PR1/PR2/PR3. The mask sections PR1/PR2/PR3 were used to form molds to shape the cores of capacitor crowns that are patterned by etching in step 4 below to produce the result shown in FIG. 2 with a set of intercore, capacitor-core-shaping cavities CC1/CC2 formed below windows W1 and W2 respectively (to serve as molds for capacitor cores) in FIG. 2, by plasma dry etching between sacrificial structures SS1, SS2 and SS3.

Figure 3:
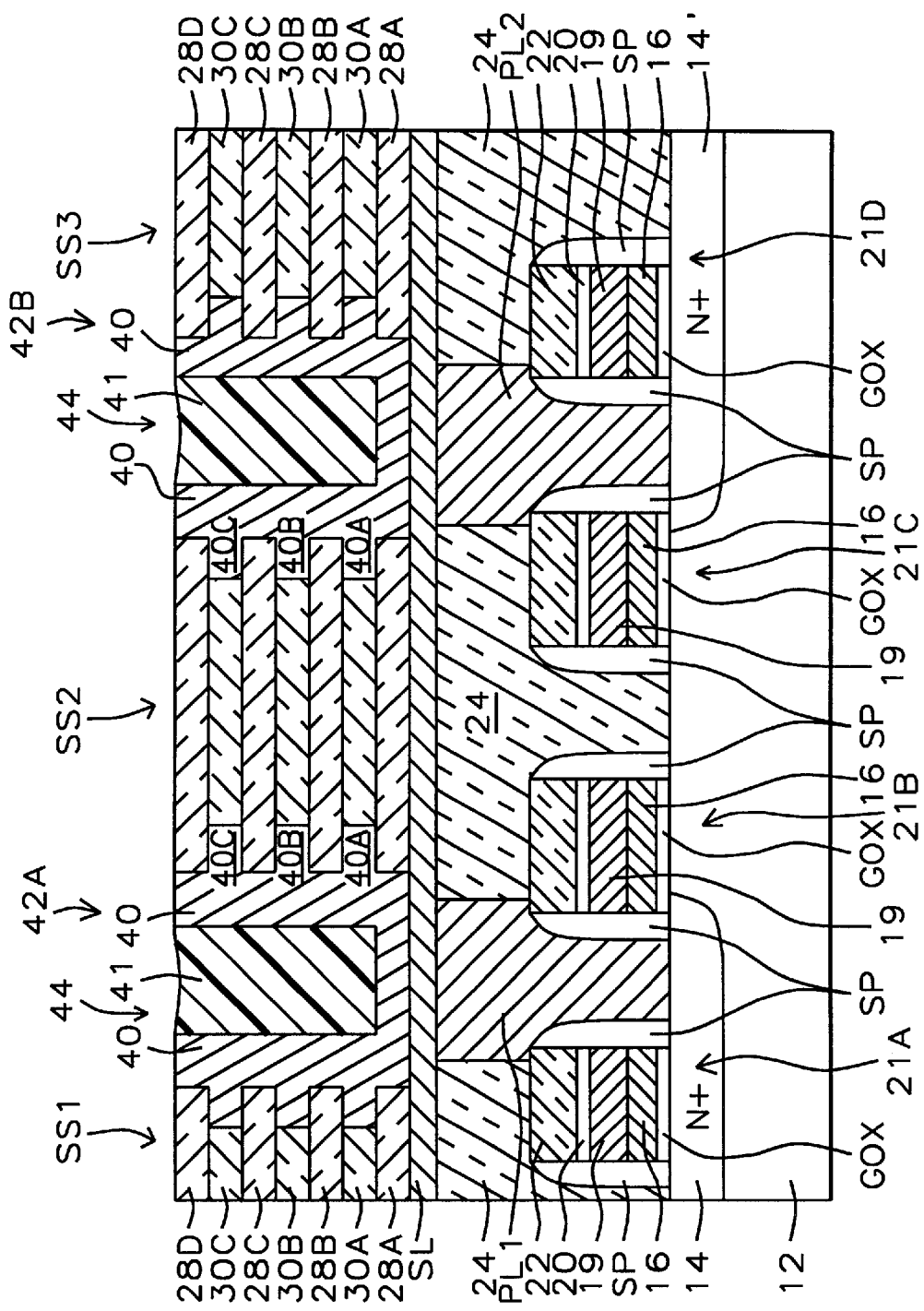
FIG. 3 shows a first embodiment of the device of FIG. 2 after thin film monolithic crown capacitor cores have been formed in the cavities on the sidewalls of the stacks of laminated, blanket layers formed over the first conductive layer. Photoresist fills the hollow spaces within the monolithic capacitor cores.
Figure 4:
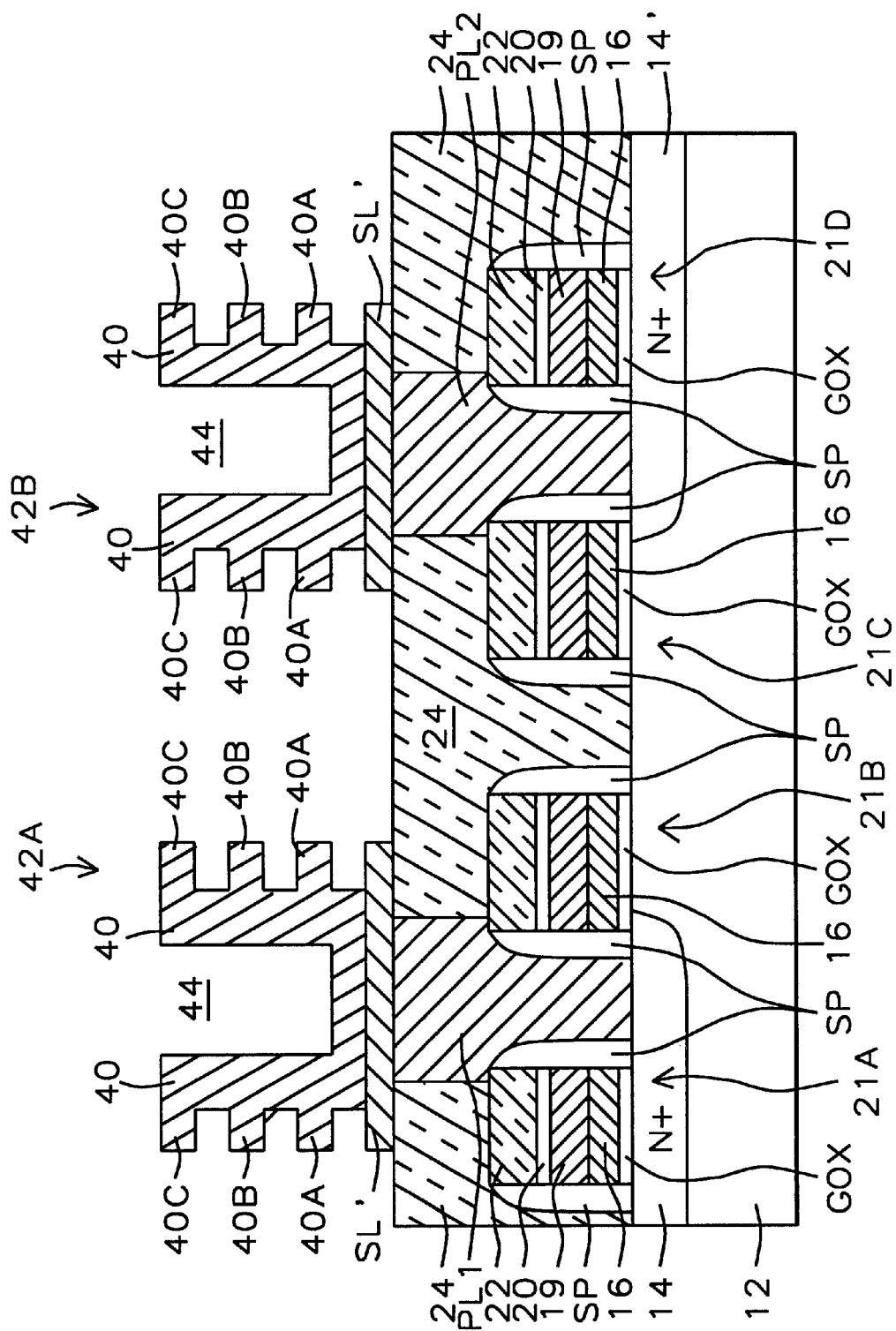
FIG. 4 shows the device of FIG. 3 after the monolithic capacitor cores have been polished down, the molds have been removed, and the first conductive layer has been etched in a self-aligned etch.
Figure 5:
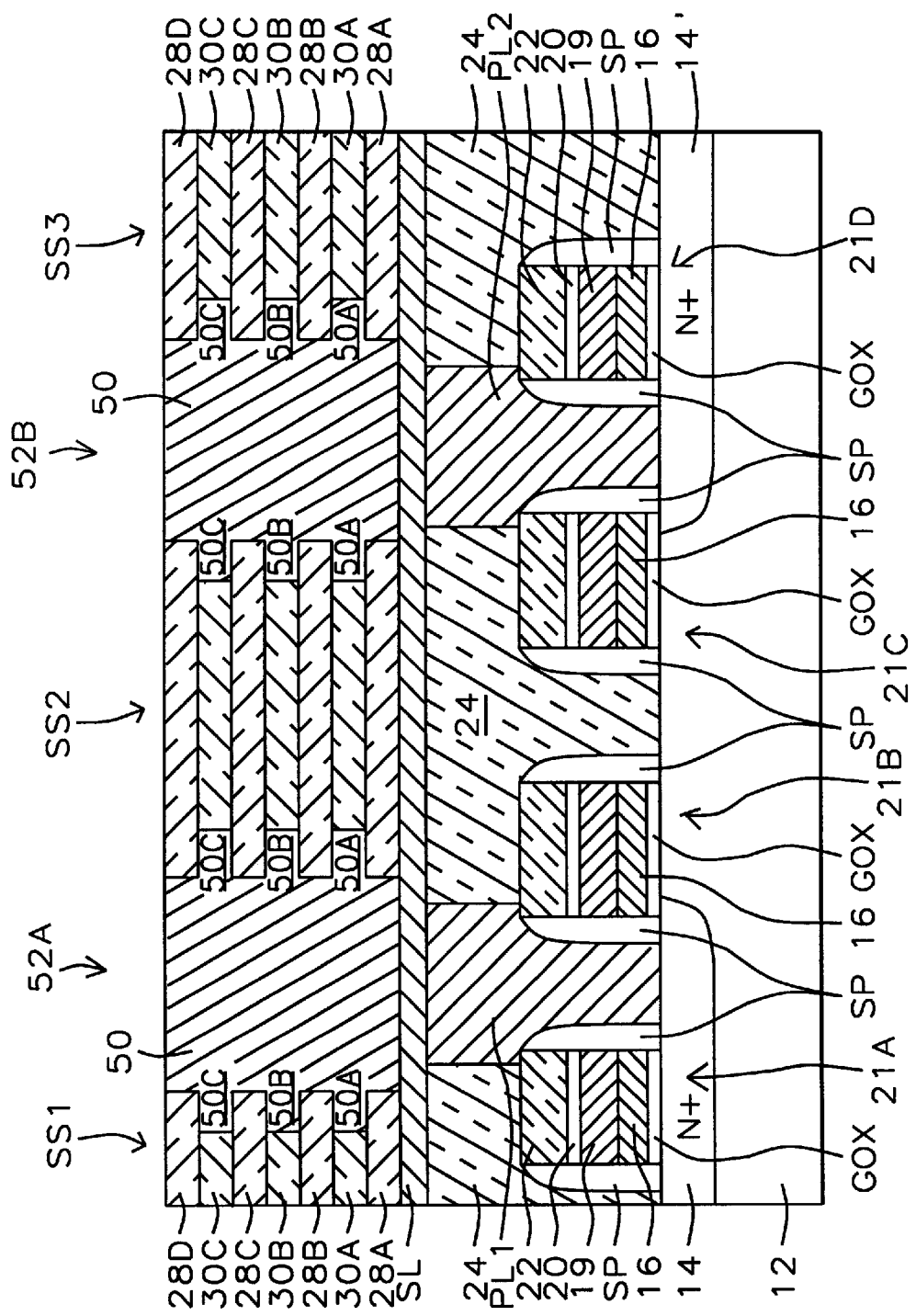
FIG. 5 shows a second embodiment of the device of FIG. 2 after solid stack monolithic capacitor cores have been formed in the cavities over the first conductive layer.
Figure 6:
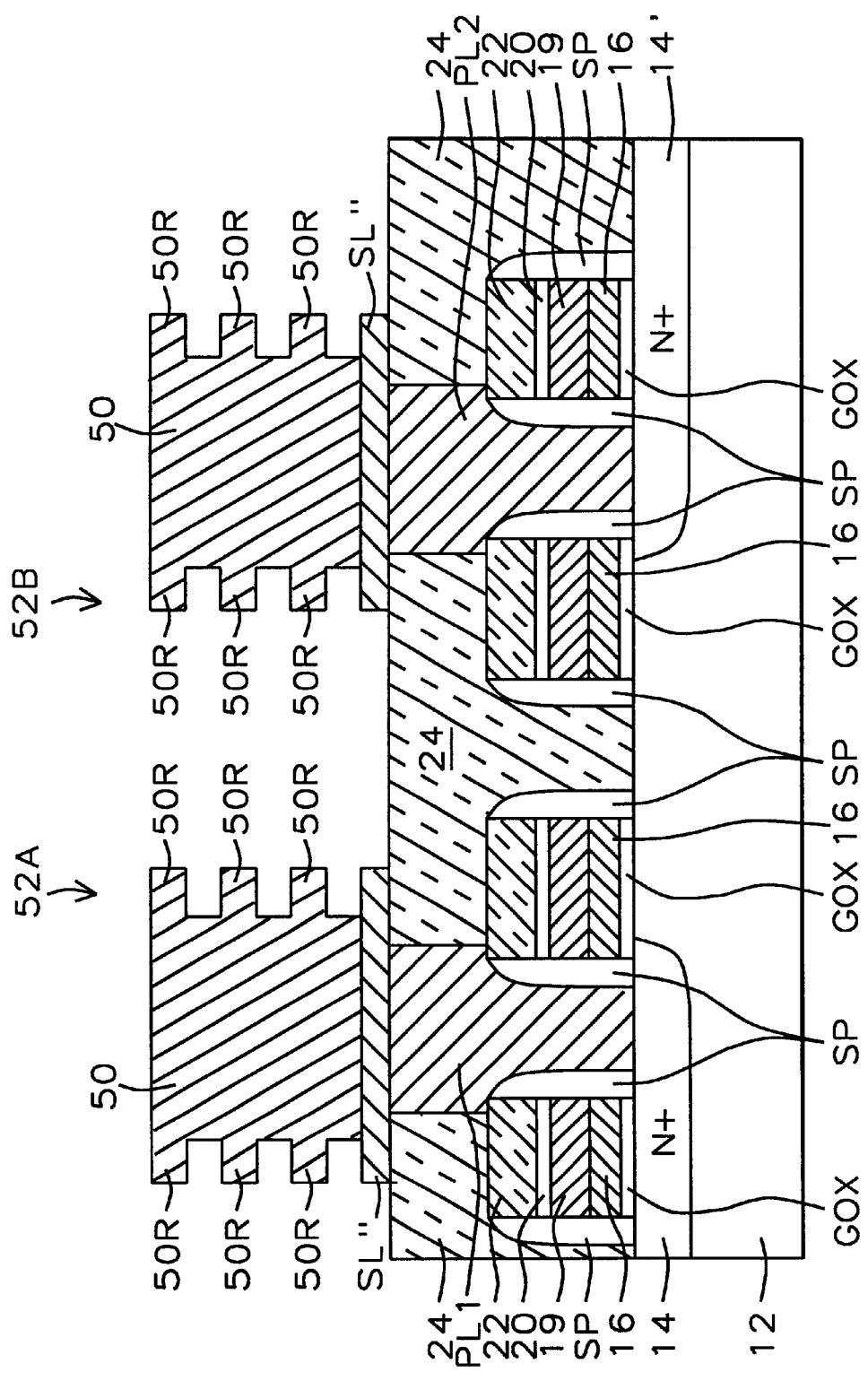
FIG. 6 shows the device of FIG. 5 after the monolithic capacitor cores have been polished down, the molds have been removed, and the first conductive layer has been etched in a self-aligned etch.

The laminated, sacrificial molds SS1, SS2 and SS3 are shown protected by patterning photoresist mask sections PR1/PR2/PR3 which were formed for the purpose of protecting the molds SS1, SS2 and SS3 during patterning of the alternating laminated layers 28A–28D and 30A–30C by etching of those laminated layers to form intercore, capacitor-core-shaping cavities CC1 and CC2 above the plugs PL1 and PL2 respectively in complementary patterns to the capacitor crowns which are to be formed subsequently as indicated by FIGS. 3 and 4 for the first embodiment and by FIGS. 5 and 6 for the second embodiment.

Then the intercore cavities CC1/CC2 (which are to be used as sacrificial molds for shaping capacitor cores seen in FIGS. 4 and 6) are formed in the shape of the photoresist mask elements PR1, PR2, and PR3 by plasma dry etching between molds (sacrificial structures) SS1–SS3 as described in step 3 below.

Next, the device is etched again in step 4 to produce the undercuts UC seen in FIG. 2.

Step 4

A differential rate of etching back the undoped silicon dioxide layers 28A/28B/28C/28D (slowly) and the doped BPSG layers 30A/30B/30C (more rapidly) is performed to enlarge the intercore, capacitor-core-shaping CC1/CC2 with a vapor solution of hydrogen fluoride (HF). The silicon dioxide and BPSG are etched in an atmosphere of water vapor and hydrogen fluoride (HF) which provides a vapor etchant. The BPSG layers 30A/30B/30C are etched back at a greater rate than the undoped silicon dioxide layer providing an undercut UC in BPSG glass layers 30A/30B/30C leaving cantilevered ribs CR of $SiO_2$ layers 28A/28B/28C/28D which now project into the intercore cavities CC1/CC2.

One can tune doped/undoped selectivity by varying the concentration of hydrogen fluoride HF and water vapor.

First Embodiment

The first embodiment of the process continues after step 4 comprising the following steps:

Step 5A

FIG. 3 shows the device of FIG. 2 after thin film crown capacitor cores 42A/42B have been formed in the cavities CC1 and CC2 on the sidewalls of stacks SS1–SS3. The cores 42A/42B are preferably monolithic in the sense that they are formed of a single homogeneous, conductive, core layer 40.

Then a filler layer 41 of a material such as photoresist fills the hollow spaces within the capacitor cores 42A/42B.

In the case of the crown capacitor cores 42A/42B in FIGS. 3, deposit a conformal, thin polysilicon, second conductive, core layer 40 into cavity blanketing the top of first conductive layer SL SL and coating the walls of the molds SS1, SS2 and SS3, as shown in FIG. 3 to form crown capacitor cores 42A/42B from conductive core layer 40, leaving the openings 44 only partially filled by the thin layer of conductive material 40. Conductive core layer 40 can be composed of an electrically conductive material selected from the group consisting of aluminum, copper, tungsten, doped polysilicon, and titanium nitride. Conductive material 40 has a thickness from about 500 Å to about 1,000 Å.

Step 6A

FIG. 4 shows the device of FIG. 3 after the capacitor cores 42A/42B have been polished down and the molds have been removed.

As can be seen in FIG. 4 counterpart cantilevered ribs 40A, 40B, 40C have been formed where the cores extend out into the space where the undercut regions UC had been located in the molds SS1, SS2 and SS3.

Referring to the crown capacitor cores 42A/42B in FIG. 4 after the openings 44 which were filled with filler (photoresist) layer 41 and then polished by a CMP (Chemical Mechanical Planarization) process to remove polysilicon layer 28D and portion of core layer 40 above the rib 40C.

Thus, the cores have been planarized by the CMP process which removes a top undoped layer 28D of the molds SS1–SS3 whereby the cores 42A/42B have a flat upper surface with a rib 40C located on top of each of the cores 42A/42B.

Step 7A

The first part of the step 7A is to remove the filler layer 41 (photoresist) in the conventional manner.

Then, remove the mold formed by silicon dioxide/BPSG layers 28A/30A/28B/30B/28C/30C/28D from the inside and the outside of the crown capacitor cores 42A/42B subtractively in a process which removes the $SiO_2$ layers 28A/28B/28C/28D and the BPSG glass layers 30A/30B/30C by a step with a Buffered Oxide Etching (BOE) solution which leaves the crown shape with the horizontal fins which consists of the first conductive layer SL and the second conductive, core layer 40.

Then dry etch back polysilicon first conductive layer SL in a self-aligned etch using the crown capacitor cores 42A/42B as masks to isolate the individual capacitor cores 42A/42B.

Second Embodiment

The process continues after step 4 comprising the following steps:

Step 5B

FIG. 5 shows a second embodiment of the device of FIG. 2 after solid stack capacitor cores 52A/52B have been formed in the cavities over the first conductive layer SL. The cores 52A/52B are preferably monolithic in the sense that they are formed of a single homogeneous material. The capacitor cores 52A/52B of FIGS. 5 are formed from a thick polysilicon layer 50 blanketing the top of device 10 as shown in FIGS. 5 and 6 to form a set of solid stack conductive capacitor cores 52A/52B formed by of a core layer 50 of conductive material. Layer 50 can be composed of an electrically conductive material selected from the group consisting of aluminum, copper, tungsten, doped polysilicon, and titanium nitride.

As can be seen in FIG. 5 counterpart cantilevered ribs 50R have been formed where the cores extend out into the space where the undercut regions UC had been located in the molds SS1, SS2 and SS3.

Step 6B

FIG. 6 shows the device of FIG. 5 after the capacitor cores have been polished down, the molds have been removed, and the first conductive layer has been etched in a self-aligned etch.

In the case of the thick core layer 50 of FIG. 6 the CMP can be applied directly to the top of the cores 50 of stack capacitor cores 52A/52B to produce the planarized structures 52A/52B, as shown in FIG. 6 to remove the portion of core layer 50 above the top rib 50R.

Thus, the cores 52A/52B have been planarized by the CMP process which removes a top undoped layer 28D of the molds SS1–SS3 whereby the cores 52A/52B have a flat upper surface with a rib 50R located on top of each of the cores 52A/52B.

Step 7B

Next, remove the mold comprising the layers 28A/30A/28B/30B/28C/30C/28D of silicon dioxide and BPSG from the inside and the outside of the capacitor structures 52A/52B by a subtractive process which removes the $SiO_2$ layers 28A/28B/28C/28D by the steps of a BOE process and the BPSG glass layers 30A/30B/30C with by the steps of a BOE process.

Then etch back polysilicon first conductive layer SL SL in a dry etching such as an RIE process using the capacitor structures 52A/52B as self-aligned masks to isolate the individual capacitor structures 52A/52B.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A process comprising steps in the sequence as follows:
   form a conductive sublayer directly on top of each of a plurality of conductive plugs and a glass planarizing insulating layer which covers gate electrode/conductor stacks having spacers on the sides thereof, with the conductive plugs in direct contact with the silicon dioxide spacers,
   form a plurality of molds on the conductive sublayer, the plurality of molds comprising a stack of silicon dioxide layers which are alternatingly undoped, doped with a dopant, and undoped with the stack comprising a bottom layer formed on top of the conductive sublayer and each additional layer in the stack formed on a previous one of the layers in the stack,
   pattern the silicon dioxide layers in the plurality of molds which are alternatingly doped and undoped to form intercore, capacitor-core-shaping cavities in the stack, reaching down through the stack to the conductive sublayer at the bottom of the stack,
   perform a differential etch of the silicon dioxide layers in the plurality of molds forming undercut edges in the doped silicon dioxide layers with the undoped silicon dioxide layers having cantilevered ribs projecting from the stack into the cavities to complete the plurality of molds,
   deposit a conductive core layer into the cavities forming a hollow capacitor cores with counterpart cantilevered ribs with a complementary pattern to the plurality of molds and the capacitor cores each each having a top surface,
   fill the hollow capacitor cores with photoresist,
   polish the hollow capacitor cores to remove the top surface of the capacitor cores,
   remove the photoresist and the plurality of molds, and
   then, after removal of the molds, perform an etch of the sublayer to separate the monolithic capacitor cores from adjacent monolithic capacitor cores thereby exposing the planarizing glass insulating layer.

2. The process of claim 1 including the steps as follows;
   the planarizing insulating layer comprises glass which covers gate electrode/conductor stacks having spacers on the sides thereof, with the conductive plugs in direct contact with the silicon dioxide spacers,
   form the conductive core layer of a material selected from the group consisting of aluminum, copper, tungsten and titanium nitride,
   perform the differential etch of the silicon dioxide layers in the plurality of molds with a combination of hydrogen fluoride vapor and water vapor, and
   remove the plurality of molds with a buffered oxide etching solution.

3. The process of claim 1 including the steps as follows:
   dope with boron and phosphorus dopant,
   perform the differential etch of said silicon dioxide layers in the plurality of molds with a combination of hydrogen fluoride vapor and water vapor, and
   remove the plurality of molds with a buffered oxide etching solution.

4. The process of claim 1 including the steps as follows:
   fill the cavities with the hollow capacitor cores,
   perform the differential etch of said silicon dioxide layers in the plurality of molds with a combination of hydrogen fluoride vapor and water vapor, and
   remove the plurality of molds with a buffered oxide etching solution.

5. The process of claim 1 including the steps as follows:
   fill the cavities with the hollow capacitor cores,
   dope boron and phosphorus dopant, and
   perform the differential etch of said silicon dioxide layers in away the plurality of molds with a combination of hydrogen fluoride vapor and water vapor, and
   remove the plurality of molds with a buffered oxide etching solution.

6. The process of claim 1 including the steps as follows:
   form the capacitor cores as monolithic capacitor cores, and
   polish the monolithic capacitor cores by a Chemical Mechanical Planarization (CMP) process which removes a top undoped layer of the plurality of molds whereby each of the monolithic capacitor cores has a flat upper surface with a rib located at the top of each of the monolithic capacitor cores.

7. A process comprising steps in the sequence as follows:
   form a conductive sublayer directly on a top of a plurality of conductive plugs and a glass planarizing insulating layer,
   form a plurality of molds over said plugs from a stack of silicon dioxide layers which are alternatingly doped and undoped on the conductive sublayer with the stack comprising a bottom layer formed on top of the conductive sublayer and each additional layer in the stack formed on a previous one of the layers in the stack, pattern the silicon dioxide layers in the plurality of molds which are alternatingly doped and undoped to form intercore, capacitor-core-shaping cavities in the stack reaching down through the stack to the conductive sublayer at the bottom of the stack, perform a differential etch of the silicon dioxide layers in the plurality of molds forming undercut edges in the doped silicon dioxide layers with the undoped silicon dioxide layers having cantilevered ribs projecting from the stack into the cavities to complete the plurality of molds, deposit a thin conductive layer into the cavities to form a thin capacitor cores with counterpart cantilevered ribs with a complementary pattern to the plurality of molds and each of the capacitor cores having an inner cavity and a top surface, fill the inner cavities with photoresist, polish the capacitor cores to remove the top surface of the capacitor cores, then remove the photoresist and the plurality of molds, and then, after removal of the molds, perform an etch of the sublayer to separate the monolithic capacitor cores from adjacent monolithic capacitor cores thereby exposing the planarizing glass insulating layer.

8. The process of claim 7 including the steps as follows:
form the thin capacitor cores of a material selected from the group consisting of aluminum, copper, tungsten and titanium nitride, and
etch away the plurality of molds.

9. The process of claim 7 including the steps as follows:
the dopant comprising boron and phosphorus, and
etch away the plurality of molds.

10. The process of claim 7 including the steps as follows:
form the plurality of molds each having a mold top,
form the capacitor cores as monolithic capacitor cores each having a core top juxtaposed with the mold top,
polish each mold top and each core top by a Chemical Mechanical Planarization (CMP) process which removes a top undoped layer of the plurality of molds and a corresponding top portion of each of the monolithic capacitor cores leaving a flat upper surface with a rib located on top of each of the monolithic capacitor cores.

11. A process comprising steps in the sequence as follows:
form a conductive sublayer in contact with a plurality of conductive plugs formed in a planarizing insulating layer,
form a plurality of molds from a stack of silicon dioxide layers which are alternatingly doped with a dopant and undoped on the conductive sublayer with the stack comprising a bottom layer formed on top of the sublayer and each additional layer in the stack formed on a previous one of the layers in the stack and including a top mold layer,
pattern the silicon dioxide layers to form intercore, capacitor-core-shaping cavities in the stack of silicon dioxide layers reaching down through the stack to the conductive sublayer at the bottom of the stack,
etch the silicon dioxide layers differentially in the plurality of molds forming undercut edges in the doped silicon dioxide layers with the undoped silicon dioxide layers having cantilevered ribs projecting from the stack into the cavities to complete the plurality of molds, deposit a thin conductive layer forming a thin capacitor cores in the cavities with counterpart cantilevered ribs with a complementary pattern to the plurality of molds and the capacitor cores having a top capacitor cores surface leaving inner cavities, deposit a layer filling the inner cavities;

polish to remove the top mold layer and the top capacitor cores surface; and remove the plurality of molds.

12. The process of claim 11 including removing the plurality of molds by etching with a buffered oxide etching solution.

13. The process of claim 11 including the steps as follows:
the dopant comprising boron and phosphorus, and
differentially etching said silicon dioxide layers in the plurality of molds with a combination of hydrogen fluoride vapor and water vapor.

14. The process of claim 11 including the steps as follows:
polish the capacitor cores by a Chemical Mechanical Planarization (CMP) process which removes a top undoped layer of the plurality of molds whereby the thin capacitor cores has a flat upper surface with a rib located on top of the thin capacitor cores, and
etch the sublayer to separate the thin capacitor cores from adjacent capacitor cores.

15. The process of claim 11 including the steps as follows:
etch away the plurality of molds with a buffered oxide etching solution,
the thin conductive cores being composed of a material selected from the group consisting of aluminum, copper, tungsten, and titanium nitride, and
the thin conductive layer having a thickness from about 500 Å to about 1,000 Å.

16. The process of claim 11 including the steps as follows:
providing the dopant comprising boron and phosphorus, and
etch away the plurality of molds with a buffered oxide etching solution,
form the thin conductive layer of a material selected from the group consisting of aluminum, copper, tungsten, and titanium nitride, and
form the thin conductive layer with a thickness from about 500 Å to about 1,000 Å.

17. The process of claim 11 including the steps as follows:
form the thin conductive cores as monolithic capacitor cores,
polish the monolithic capacitor cores by a Chemical Mechanical Planarization (CMP) process which removes a top undoped layer of the plurality of molds whereby each of the monolithic capacitor cores has a flat upper surface with a rib located on top of each of the monolithic capacitor cores,
etch the sublayer to separate each of the monolithic capacitor cores from adjacent monolithic capacitor cores,
form each of the monolithic capacitor cores from a material selected from the group consisting of aluminum, copper, tungsten, and titanium nitride, and
form each of the monolithic capacitor cores with a thickness from about 500 Å to about 1,000 Å.

18. A process comprising steps in the sequence as follows:

form a conductive sublayer in contact with a plurality of conductive plugs formed in a planarizing insulating layer, by steps in the sequence as follows:

form a plurality of molds from a stack of silicon dioxide layers which are alternatingly doped and undoped on the conductive sublayer with the stack comprising a bottom layer formed on top of the conductive sublayer and each additional layer in the stack formed on a previous one of the layers in the stack including an undoped top silicon dioxide layer on top of the stack, with doped silicon dioxide layers comprising BPSG layers, pattern the silicon dioxide layers in the plurality of molds which are alternatingly doped and undoped to form intercore, capacitor-core-shaping cavities in the stack reaching down through the stack to the conductive sublayer at the bottom of the stack, differentially etch the silicon dioxide layers in the plurality of molds forming undercut edges in the doped silicon dioxide layers with the undoped silicon dioxide layers having cantilevered ribs projecting from the stack into the cavities to complete the plurality of molds, deposit a thin conductive layer into the cavities to form a thin capacitor cores with counterpart cantilevered ribs with a complementary pattern to the plurality of molds and the capacitor cores having inner cavities and a top surface, each of the monolithic capacitor cores being formed of a material selected from the group consisting of aluminum, copper, tungsten, and titanium nitride and each of the monolithic capacitor cores having a thickness from 500 Å to 1,000 Å, deposit photoresist into the inner cavities, polish away the undoped top silicon dioxide layer of the plurality of molds and the top surface of the capacitor cores by a Chemical Mechanical Planarization (CMP) process which removes the top undoped layer of the plurality of molds whereby the thin capacitor cores has a flat upper surface with a rib located on top of the thin capacitor cores, remove the photoresist and etch away the plurality of molds with a combination of hydrogen fluoride vapor and water vapor, and etch back the sublayer to separate the thin capacitor cores from adjacent capacitor cores.

* * * * *